(12) United States Patent
Shi

(10) Patent No.: US 12,217,925 B2
(45) Date of Patent: Feb. 4, 2025

(54) RADIO FREQUENCY MICRO-ELECTRO-MECHANICAL SWITCH AND RADIO FREQUENCY DEVICE

(71) Applicants: Beijing BOE Technology Development Co., Ltd., Beijing (CN); BOE TECHNOLOGY GROUP CO., LTD., Beijing (CN)

(72) Inventor: Yingli Shi, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/796,501

(22) PCT Filed: Aug. 25, 2021

(86) PCT No.: PCT/CN2021/114538
§ 371 (c)(1),
(2) Date: Jul. 29, 2022

(87) PCT Pub. No.: WO2023/023976
PCT Pub. Date: Mar. 2, 2023

(65) Prior Publication Data
US 2024/0186095 A1 Jun. 6, 2024

(51) Int. Cl.
*H01H 59/00* (2006.01)
*B81B 3/00* (2006.01)

(52) U.S. Cl.
CPC ....... *H01H 59/0009* (2013.01); *B81B 3/0021* (2013.01); *B81B 2201/018* (2013.01);
(Continued)

(58) Field of Classification Search
CPC ......... H01H 2059/0027; H01H 1/0036; H01H 2001/0036; H01H 59/0009;
(Continued)

(56) References Cited

U.S. PATENT DOCUMENTS 7,145,402 B2 * 12/2006 Mattila ................... H03L 1/026
331/18
2003/0011518 A1 1/2003 Sievenpiper
(Continued)

FOREIGN PATENT DOCUMENTS

CN 101262083 A 9/2008
CN 101681695 A 3/2010
(Continued)

*Primary Examiner* — Anthony R Jimenez
(74) *Attorney, Agent, or Firm* — HOUTTEMAN LAW LLC

(57) ABSTRACT

The present disclosure provides a radio frequency micro-electro-mechanical switch and a radio frequency device, belong to the field of micro-electro-mechanical systems technology, and can at least partially solve a problem that functional performance of an existing radio frequency micro-electro-mechanical switch is easily to be affected in scenarios such as bending deformation of devices. The radio frequency micro-electro-mechanical switch provided by the present disclosure includes: a substrate; and a signal electrode, a first ground electrode, a second ground electrode and a connecting membrane bridge disposed on the substrate, the connecting membrane bridge crosses over the signal electrode, two ends of the connecting membrane bridge are connected to the first ground electrode and the second ground electrode respectively, and the connecting membrane bridge includes a stretchable structure being stretchable in a stretchable direction the same as an extending direction in which the connecting membrane bridge extends.

12 Claims, 2 Drawing Sheets

(52) U.S. Cl.
CPC . *B81B 2203/0109* (2013.01); *B81B 2203/019* (2013.01); *H01H 2059/0027* (2013.01)

(58) Field of Classification Search
CPC ............ H01H 2057/006; H01H 59/00; H01H 2205/004; H01H 2203/02; B81B 3/0021; B81B 2201/018; B81B 2203/0109; B81B 2203/019; B81B 3/00; B81B 3/0035; B81B 3/004; B81B 3/0072; B81B 2203/00; B81B 2203/0118; B81B 2203/0136; B81B 2201/01; B81B 2201/014; B81B 2203/0315; B81B 2203/04; B81C 1/00; B81C 1/00015; B81C 1/00119; B81C 1/00182; B81C 2201/01; B81C 2203/00; B81C 2203/01; B81C 2203/0015; B81C 2203/00365; B81C 2203/00476; B81C 2203/00619; B81C 2203/00626; B81C 2203/00666

USPC .................................................. 200/181, 514
See application file for complete search history.

(56) References Cited

U.S. PATENT DOCUMENTS

2011/0259717 A1    10/2011  Pillans et al.
2019/0273177 A1*   9/2019   Hopkin ................. B81C 99/002

FOREIGN PATENT DOCUMENTS

| CN | 101777677 A | 7/2010 |
| CN | 109375096 A | 2/2019 |
| CN | 110745772 A | 2/2020 |
| CN | 111554638 A | 8/2020 |
| IN | 102243940 A | 11/2011 |
| IN | 108695579 A | 10/2018 |

* cited by examiner

RADIO FREQUENCY MICRO-ELECTRO-MECHANICAL SWITCH AND RADIO FREQUENCY DEVICE

TECHNICAL FIELD

The present disclosure belongs to the field of Micro-Electro-Mechanical Systems (MEMS) technology, and particularly relates to a radio frequency micro-electro-mechanical switch and a radio frequency device.

BACKGROUND

Radio frequency micro-electro-mechanical systems (RF MEMS) are new technology combining the MEMS technology with the RF technology, and MEMS devices have the advantages of small volume, easy integration, low power consumption and high reliability, and can replace semiconductor devices in conventional wireless communication systems.

The RF MEMS can not only be applied to circuits in the form of devices, such as RF micro-electro-mechanical switches, MEMS capacitors and MEMS resonators, but can also be applied in the form of integrating independent devices into a same chip to form an assembly and an application system, such as a filter, a voltage-controlled oscillator, a phase shifter and a reconfigurable antenna. In this way, volumes of conventional devices are greatly reduced, power consumption is reduced, and system performance is improved. The RF micro-electro-mechanical switches are important devices in the RF MEMS, and performance of the RF micro-electro-mechanical switches has a significant influence on the MEMS.

SUMMARY

The present disclosure at least partially solves a problem that functional performance of the existing radio frequency micro-electro-mechanical switch is easily to be affected in scenarios such as bending deformation of devices, and provides a radio frequency micro-electro-mechanical switch capable of adapting to application scenarios such as a scenario involving bending deformation.

A technical solution to the technical problem of the present disclosure is a radio frequency micro-electro-mechanical switch, including:
  a substrate: and
  a signal electrode, a first ground electrode, a second ground electrode and a connecting membrane bridge,
  wherein the signal electrode, the first ground electrode, the second ground electrode and the connecting membrane bridge are disposed on the substrate, the connecting membrane bridge crosses over the signal electrode, and two ends of the connecting membrane bridge are connected to the first ground electrode and the second ground electrode respectively, and
  the connecting membrane bridge includes a stretchable structure being stretchable in a stretchable direction the same as an extending direction in which the connecting membrane bridge extends.

In some implementations, the connecting membrane bridge extends in a first direction; and the stretchable structure includes:
  a plurality of first connection portions arranged in the first direction and each extending in a second direction that intersects the first direction; and
  a plurality of second connection portions, each of the second connection portions extending in the first direction,
  wherein any two adjacent first connection portions are connected end to end through the second connection portion.

In some implementations, each of lengths of the second connection portions is not greater than each of lengths of the first connection portions.

In some implementations, the connecting membrane bridge includes a plurality of stretchable structures: and
  in part of the stretchable structures, the first connection portions have the same length and different widths: and the second connection portions have the same length and the same width.

In some implementations, the connecting membrane bridge further includes: a body portion: and an end of the body portion is connected to the first ground electrode through at least one stretchable structure, and another end of the body portion is connected to the second ground electrode through at least one stretchable structure.

In some implementations, the body portion includes: a base material of the connecting membrane bridge provided with a plurality of opening patterns therein, and the opening patterns each penetrate through the base material of the connecting membrane bridge.

In some implementations, the plurality of opening patterns are uniformly arranged.

In some implementations, shapes of the opening patterns include a circular shape.

In some implementations, a thickness of the base material of the connecting membrane bridge is in a range from 1 µm to 3 µm.

In some implementations, the body portion and the stretchable structure are formed into one piece.

In some implementations, a material of the connecting membrane bridge includes a conductive metal.

In some implementations, the substrate includes a flexible substrate.

Another technical solution to the technical problem of the present disclosure is a radio frequency device, including the radio frequency micro-electro-mechanical switch described above.

In some implementations, the radio frequency device includes: any one of a filter, a voltage-controlled oscillator, a phase shifter and a reconfigurable antenna.

BRIEF DESCRIPTION OF DRAWINGS

The accompanying drawings are intended to provide a further understanding of the present disclosure, and constitute a part of the specification. The drawings are used to explain the present disclosure in conjunction with the specific implementations below, but do not constitute any limitation to the present disclosure. In the drawings.

Figure 1:
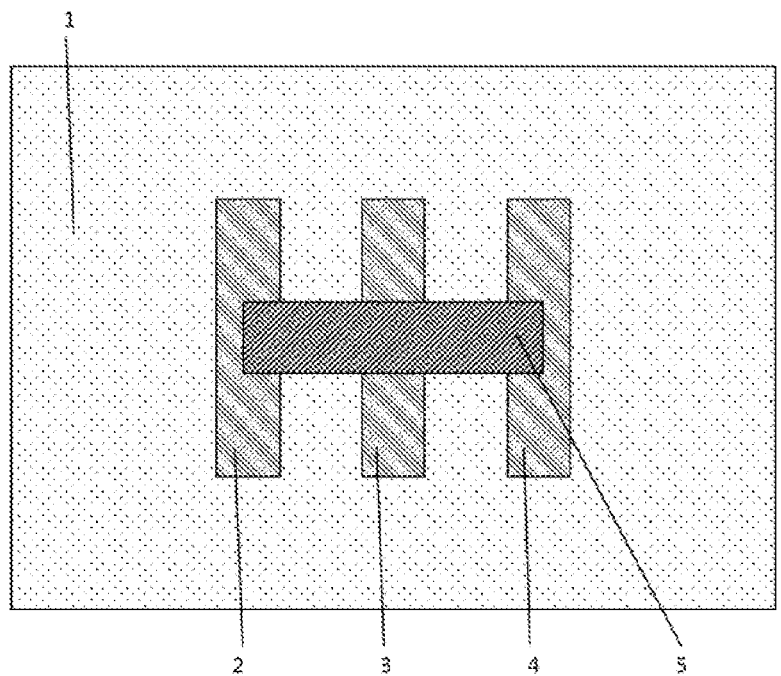
FIG. 1 is a schematic diagram of a planar structure of an RF micro-electro-mechanical switch according to the present disclosure.

In the drawings, reference numerals include: 1. substrate: 2. first ground electrode: 3. signal electrode: 4. second ground electrode: 5. connecting membrane bridge: 51. stretchable structure: 52. body portion.

DETAIL DESCRIPTION OF EMBODIMENTS

In order to enable those skilled in the art to better understand the technical solutions of the present disclosure, the present disclosure is further described in detail below with reference to the drawings and specific implementations.

In the present disclosure, "disposing two structures in a same layer" refers to that the two structures are formed from a same material layer, and thus are located in the same layer in terms of stacking relationship, but does not mean that distances from the two structures to a substrate are the same, or other layer structures between one of the two structures and the substrate and between the other one of the two structures and the substrate are completely the same.

In the present disclosure, "patterning process" refers to steps of forming a structure having a specific pattern, and may be a photolithography process including one or more steps of forming a material layer, coating a photoresist, exposing, developing, etching, and stripping off the photoresist: certainly, the "patterning process" may also be an imprinting process, an inkjet printing process, or other processes.

The present disclosure will be further described in detail below with reference to the drawings. The same elements are denoted by similar reference numerals in all the drawings. For the purpose of clarity, the parts shown in the drawings are not drawn to scale. Moreover, some well-known parts may not be shown in the drawings.

Various specific details of the present disclosure, such as structures, materials and sizes of components, and processing processes and techniques, are described below for enabling a clearer understanding of the present disclosure. However, as understood by those skilled in the art, the present disclosure may be implemented without those specific details.

RF switches designed and manufactured by adopting the MEMS technology have the advantages of low insertion loss and low electric power consumption. RF MEMS switches are the most basic elements of electronic circuit systems such as wireless communication systems, and are widely applied to radar detection and wireless communication. Compared with conventional PIN diode switches and FET switches, the RF MEMS switches have the outstanding advantages of low insertion loss, low electric power consumption, and less distortion of transmission signals. The RF MEMS switches may be divided into connecting-membrane-bridge RF MEMS switches and cantilever RF MEMS switches according to different geometric structures. The switches with a cantilever structure have a larger insertion loss, while the switches adopting a connecting membrane bridge structure have a smaller insertion loss and a higher switching speed.

With reference to FIG. 1 to FIG. 7, the present disclosure provides a connecting-membrane-bridge RF micro-electro-mechanical switch (RF MEMS switch) having a connecting membrane bridge 5. The RF MEMS switch includes: a substrate 1, and a signal electrode 3, a first ground electrode 2, a second ground electrode 4 and the connecting membrane bridge 5, the signal electrode 3, the first ground electrode 2, the second ground electrode 4 and the connecting membrane bridge 5 are disposed on the substrate 1: and the connecting membrane bridge 5 crosses over the signal electrode 3, and have two ends connected to the first ground electrode 2 and the second ground electrode 4 respectively.

Figure 2:
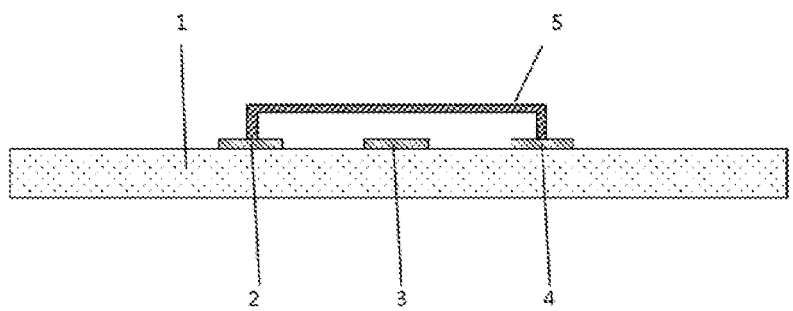
FIG. 2 is a schematic diagram of a sectional structure of an RF micro-electro-mechanical switch according to the present disclosure.
Figure 3:
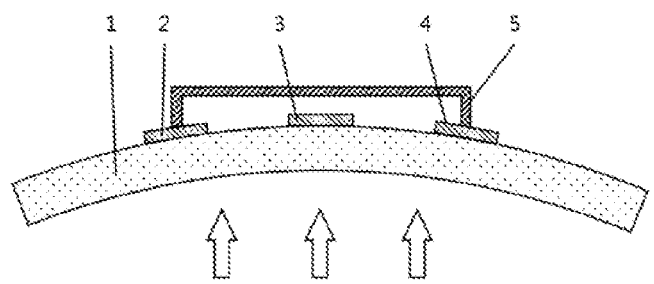
FIG. 3 is a schematic diagram of an RF micro-electro-mechanical switch in a bent state according to the present disclosure.

The connecting-membrane-bridge RF MEMS switch adopts a bridge structure supported at two ends thereof. With reference to FIG. 2, the signal electrode 3 is located between the first ground electrode 2 and the second ground electrode 4, and the connecting membrane bridge 5 crosses over the signal electrode 3, that is, an orthographic projection of the connecting membrane bridge 5 on the substrate 1 overlaps an orthographic projection of the signal electrode 3 on the substrate 1. Meanwhile, the two ends of the connecting membrane bridge 5 are connected to the first ground electrode 2 and the second ground electrode 4, respectively. When a driving voltage is applied to the signal electrode 3, the connecting membrane bridge 5 is bent downwards due to electrostatic attraction between the electrodes. When the driving voltage reaches a certain level, the connecting membrane bridge 5 is bent down to reach a lower electrode, thereby forming a path.

In some examples, a dielectric layer is disposed on an upper surface of the signal electrode 3 in order to isolate DC signals while conducting AC signals, i.e., allowing the AC signals to pass through.

In related art, the RF MEMS switches are typically rigid devices. With the development of display technologies such as flexible display technology, and irregular non-planar display technology, when a rigid RF MEMS switch is applied, functional characteristics of the RF MEMS switch, such as drive response, may fail or become poor when the connecting membrane bridge 5 is subjected to a tensile stress caused due to bending.

In the RF MEMS switch provided by the present disclosure, the connecting membrane bridge 5 includes a stretchable structure 51 being stretchable in a stretchable direction the same as an extending direction in which the connecting membrane bridge 5 extends. That is to say, in the present disclosure, the connecting membrane bridge 5 is endowed with certain stretchability in the extending direction thereof based on the configuration of the stretchable structure 51, so that the RE MSMS switch can eliminate the tensile stress in application scenarios such as being bent and being stretched, thereby avoiding a change of the functional characteristics of the RE MSMS switch, such as the drive response, in those application scenarios.

In the present disclosure, the stretchable structure 51 of the connecting membrane bridge 5 may realize the stretchability thereof through a design of a shape and a material of the stretchable structure 51, etc. In some implementations, the stretchable structure 51 may be designed into a configuration based on a zigzag shape. The configuration includes a plurality of repeated zigzag shapes connected and alternately arranged. The zigzag shapes may be any shape, such as a circular shape, a shape like a character "N", a shape like a character "V", and a shape like a character "S".

In some implementations, the connecting membrane bridge 5 extends in a first direction: the stretchable structure 51 includes: a plurality of first connection portions arranged in the first direction and each extending in a second direction that intersects the first direction: and a plurality of second connection portions each extending in the first direction, any two adjacent first connection portions are connected end to end through the second connection portion.

Figure 4:
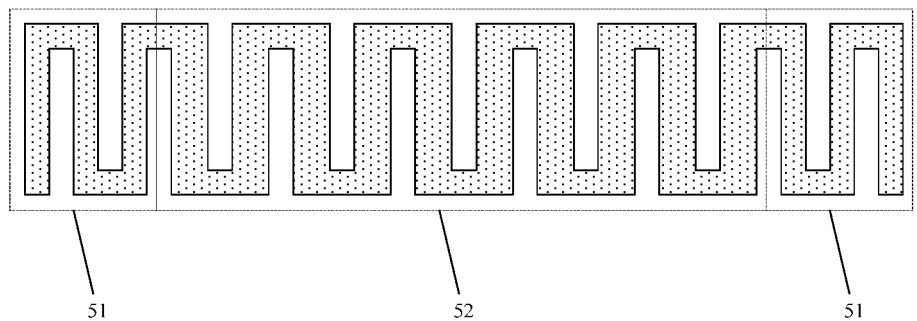
FIG. 4 is a schematic structural diagram of a connecting membrane bridge of an RF micro-electro-mechanical switch according to the present disclosure.

With reference to FIG. 4, the stretchable structure 51 includes the plurality of first connection portions and the plurality of second connection portions. The first connection portions each extend in the second direction (the vertical direction in FIG. 4), and meanwhile the plurality of first connection portions are arranged in the first direction (the horizontal direction in FIG. 4). Each of the first connection portions has two ends in the second direction. A first end of each first connection portion is connected to another first connection portion adjacent thereto in the first direction, through the second connection portion, a second end of each first connection portion is connected to another first connection portion adjacent thereto in the first direction, through another second connection portion, and meanwhile, each end of each of the first connection portions is connected to at most one another first connection portion adjacent thereto. In this way, the plurality of first connection portions are sequentially connected end to end through the plurality of second connection portions to form a serpentine feature structure, so that the stretchable structure 51 is stretchable in the first direction.

Dimensions of the first connection portions, such as lengths and widths, and dimensions of the second connection portions, such as lengths and widths, may be preset as desired.

In some implementations, each of lengths of the second connection portions is not greater than each of widths of the first connection portions. With reference to FIG. 4, the stretchable direction of the stretchable structure 51 is the first direction, and an extending direction of the stretchable structure 51 is also the first direction. The lengths of the second connection portions are the dimensions of the second connection portions in the first direction. The widths of the first connection portions are the dimensions of the first connection portions in the first direction. It should be understood that a stretchable deformation of the stretchable structure 51 is related to the widths of the first connection portions and the lengths of the second connection portions. When the lengths of the second connection portions are too large, the whole structure of the stretchable structure 51 is easily to be loosened, which is not favorable for stability of the whole connecting membrane bridge 5. In the present disclosure, by confining the lengths of the second connection portions and the widths of the first connection portions, the stretchable structure 51 is relatively stable while having a certain stretchable deformation, so that the functional characteristics of the RE MSMS switch, such as the drive response, do not change in the application scenarios such as being bent and being stretched.

In some implementations, the connecting membrane bridge 5 includes a plurality of stretchable structures 51: and in part of the stretchable structures 51, the first connection portions have different widths. With reference to FIG. 4, in part of the stretchable structures 51, the first connection portions of different stretchable structures 51 have the same length and different widths. Meanwhile, the second connection portions of the stretchable structures 51 have the same length and the same width. In the case where the second connection portions of the stretchable structures 51 are the same, the widths of the first connection portions determine structural stability of the stretchable structures 51 in the second direction and overall supporting strength of the stretchable structures 51. The larger the widths of the first connection portions are, the larger the overall supporting strength of the stretchable structures 51 is. In the present disclosure, the stretchable structures 51 having different configurations may be disposed in different regions of the connecting membrane bridge 5, so as to relieve different tensile stresses subjected by different regions of the connecting membrane bridge 5 in the scenarios of being bent, being stretched, etc.

With reference to FIG. 4, in some implementations, the connecting membrane bridge 5 may include the first stretchable structure 51 and second stretchable structures 51 located on two sides of the first stretchable structure 51. The first stretchable structure 51 includes a plurality of the first connection portions and a plurality of the second connection portions: and the second stretchable structure 51 may include a plurality of first connection portions and a plurality of second connection portions. The widths of the first connection portions of the first stretchable structure 51 each are greater than those of the first connection portions of the second stretchable structure 51. Meanwhile, all the first connection portions of the first stretchable structure 51 and the second stretchable structures 51 have the same length, and all the second connection portions of the first stretchable structure 51 and the second stretchable structures 51 have the same length and the same width. It should be understood that, in the present disclosure, the connecting membrane bridge 5 may not be limited to the first stretchable structure 51 and the second stretchable structures 51, but may further include the stretchable structures 51 with other configurations, which will not be described in detail here.

Figure 5:
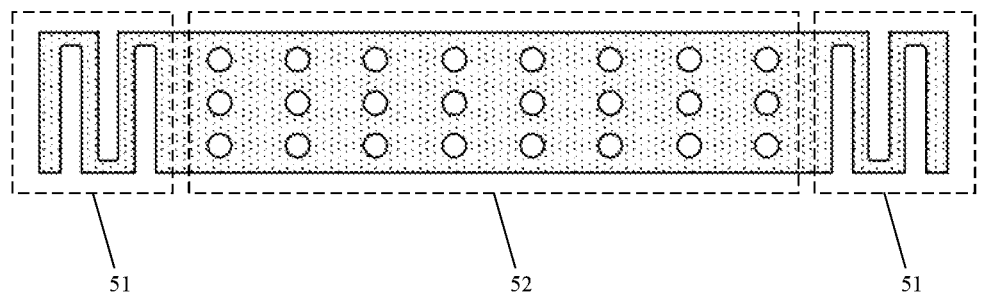
FIG. 5 is a schematic structural diagram of a connecting membrane bridge of an RF micro-electro-mechanical switch according to the present disclosure.

In some implementations, the connecting membrane bridge 5 further includes: a body portion 52: an end of the body portion 52 is connected to the first ground electrode 2 through at least one stretchable structure 51, and another end of the body portion 52 is connected to the second ground electrode 4 through at least one stretchable structure 51. With reference to FIG. 5, in the present disclosure, the body portion 52 may be a plate-shaped structure, and the two ends of the body portion 52 are respectively connected to the first ground electrode 2 and the second ground electrode 4 through the stretchable structures 51. Each end of the body portion 52 may be connected to the corresponding ground electrode through one or more stretchable structures. With reference to FIG. 5, the two ends of the body portion 52 may be connected to the ground electrodes through two stretchable structures 51, respectively. The stretchable directions of the two stretchable structures 51 are consistent with an extending direction of the body portion 52.

In some implementations, the body portion 52 includes: a base material of the connecting membrane bridge 5 provided with a plurality of opening patterns therein, and the opening patterns each penetrate through the base material of the connecting membrane bridge 5. With reference to FIG. 2 and FIG. 5, the body portion 52 is located above the signal electrode 3. A residual stress of the connecting membrane bridge 5 generated in a processing process may be changed by providing the opening patterns in the base material of the connecting membrane bridge 5, so that an equivalent elastic modulus of the base material of the connecting membrane bridge 5 can be reduced. A driving voltage of the RF MEMS switch is closely related to the connecting membrane bridge 5. In practical applications, the RF MEMS switch is to be integrated with other microwave devices, and therefore, it is better when the driving voltage of the RF MEMS switch is smaller. It can be known according to a calculation formula of a driving electrode that an elastic coefficient of the connecting membrane bridge 5 is closely related to the driving voltage, so that the driving voltage desired by the switch may be reduced by reducing a height of the connecting membrane bridge 5 or reducing the elastic coefficient of the connecting membrane bridge 5. However, reducing the height of the bridge not only put forwards high expectations on processes for manufacturing the switch, but also may reduce isolation degree of the switch, increase a reflection loss of the switch, and degrade other performance of the switch. For reducing the elastic modulus, it is better when the connecting membrane bridge 5 is thinner: but from the perspective of product reliability, when a thickness of the connecting membrane bridge 5 is reduced to a certain extent, the connecting membrane bridge 5 is easily to be broken while being stretched when the switch operates. In the present disclosure, by providing the plurality of opening patterns in the base material of the connecting membrane bridge 5, the equivalent elastic modulus of the connecting membrane bridge 5 is reduced, thereby reducing the driving voltage desired by the switch.

Figure 6:
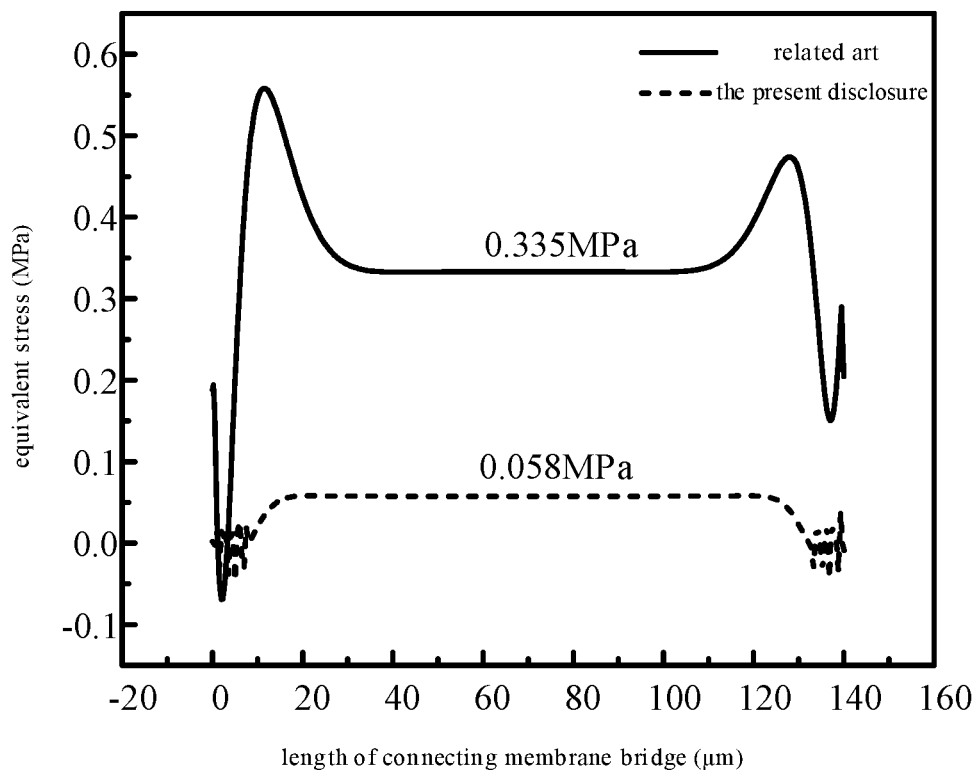
FIG. 6 is a schematic diagram of comparison of results of simulation of residual stress relief of an RF micro-electro-mechanical switch according to the present disclosure.

With reference to FIG. 6, experimental data show that, when the RF MEMS switch is subjected to bending deformation with a radius of curvature of 5 mm, a tensile stress, caused by the bending deformation and applied to a conventional connecting membrane bridge 5 in the related art, is about 0.335 MPa. When the RF MEMS switch provided by the present disclosure is subjected to the bending deformation with the radius of curvature of 5 mm, a tensile stress, caused by the bending deformation and applied to the connecting membrane bridge 5, is about 0.058 MPa, which is only 17.3% of the tensile stress applied to the conventional connecting membrane bridge 5 in the related art. Thus, a relatively ideal stress releasing effect is produced, so that a problem of failure of the drive response of the RF MEMS switch caused by an excessive tensile stress in the related art can be significantly improved.

With reference to FIG. 5, in some implementations, the plurality of opening patterns are uniformly arranged. Uniform distribution of equivalent elastic moduli of the whole body portion 52 is facilitated by uniformly arranging the plurality of opening patterns in the base material of the connecting membrane bridge 5, so that the functional characteristics of the RF MEMS switch are kept stable. In some implementations, the plurality of opening patterns may be arranged in an array, or may be uniformly arranged according to other preset rules.

In some implementations, shapes of the opening patterns include a circular shape. The opening patterns each penetrate through the base material of the connecting membrane bridge 5. When the opening patterns each are of the circular shape, all openings in the base material of the connecting membrane bridge 5 have smooth sections and there are no serrated openings. Thus, when the connecting membrane bridge 5 is stretched under a force, stresses at all positions of the openings are uniform, and the openings are not prone to be cracked or broken, thereby improving structural stability of the connecting membrane bridge 5. It should be understood that, in the present disclosure, the shapes of the opening patterns may also include an ellipse, a closed pattern formed by arcs or lines, and a pattern having an arc, such as a shape like a character "S". Alternatively, the shapes of the opening patterns may include a polygonal shape, such as a rectangle or a triangle, which will not be described in detail herein.

In some implementations, a material of the base material of the connecting membrane bridge 5 may include a conductive metal. Specifically, the conductive metal may include copper, aluminum, or other metals with high conductivity.

In some implementations, a thickness of the base material of the connecting membrane bridge 5 is in a range from 1 μm to 3 μm. In the present disclosure, the connecting membrane bridge 5 crosses over the signal electrode 3, and is kept apart from the signal electrode 3 by a certain space. In order to prevent the connecting membrane bridge 5 from naturally falling down to be in contact with the signal electrode 3 when the switch is switched off, the connecting membrane bridge 5 itself is desired to have certain supporting strength. It should be understood that, when the thickness of the base material of the connecting membrane bridge 5 is too small, rigidity of the base material of the connecting membrane bridge 5 is reduced, so that the base material of the connecting membrane bridge 5 cannot support itself and is prone to collapse. However, when the thickness of the base material of the connecting membrane bridge 5 is too large, the base material of the connecting membrane bridge 5 has relatively large rigidity and is not easily to be bent, so that a relatively large driving voltage is desired to bend the base material of the connecting membrane bridge 5 to be in contact with the signal electrode 3 when the switch operates, which increases power consumption of the RF MEMS switch. The experimental data show that the connecting membrane bridge 5 can achieve better self-support without a high expectation for the driving voltage when the thickness of the base material of the connecting membrane bridge 5 is in the range from 1 μm to 3 μm.

In some implementations, the body portion 52 and the stretchable structure 51 are formed into one piece. That is, the body portion 52 and the stretchable structure 51 may be formed by a single patterning process. The body portion 52 may include a full-face plate structure or a patterned plate structure. The stretchable structure may be a patterned plate, such as a patterned plate formed by a plurality of the first connection portions and a plurality of the second connection portions. The shapes and the connection ways of the first connection portions and the second connection portions may be referred to above description, and will not repeated in detail here.

In some implementations, the substrate 1 includes a flexible substrate 1. A material of the flexible substrate 1 may include polyimide or other flexible materials. The RF MEMS switch based on the flexible substrate 1 has bendability. When the RF MEMS switch is in a bent state, the connecting membrane bridge 5 can release the tensile stress generated in the bent state through the stretchable structure 51, so that the problem of failure of the drive response of the connecting membrane bridge 5 due to an excessive tensile stress can be avoided.

In some implementations, the substrate 1 may include a stretchable substrate 1. The stretchable structure 51 of the connecting membrane bridge 5 can adapt to stretching of the substrate 1 to be stretched when the substrate 1 is in a stretched state. Compared with the rigid RF MEMS switch in the related art, the RF MEMS switch provided by the present disclosure can adapt to the stretching of the substrate 1, so that the problem of failure of the drive response of the connecting membrane bridge 5 due to an excessive tensile stress can be avoided.

In some implementations, the substrate 1 may further include an irregular shaped substrate 1, for example, a curved substrate 1, a cambered substrate 1 or other non-planar substrates.

In another aspect, the present disclosure further provides an RF device including the RF MEMS switch described above.

In some implementations, the RF device includes: any one of a tunable filter, a voltage-controlled oscillator, a phase shifter and a reconfigurable antenna.

Compared with the conventional switch, the RF MEMS switch can be used in a higher frequency band with a small loss, and thus can play an important role in microwave circuits. The membrane bridge structure of the RF MEMS switch can be widely applied to phase shifters, tunable antennas, switch-type adjustable capacitors, switch-type tunable filters and phased array antennas.

A microwave filter based on the RF MEMS switch or a PIN diode for controlling two or more passbands can be switched between the passbands, that is, the microwave filter can simultaneously perform functions of two or more filters. Moreover, the microwave filter can also serve as a switch of a circuit. Therefore, the microwave filter is widely applied to personal communication systems and radar and satellite communication systems, and plays an important role in channel selection, duplexing and image rejection.

The reconfigurable antenna (e.g., a frequency-adjustable phased array radar) may use the RF MEMS switch to control operation of units of the antenna. Switches may be added to different branches of the antenna to realize frequency reconfiguration of the antenna, and pattern reconfiguration of the antenna may also be realized. Compared with a PIN switch and an FET switch, the MEMS switch has the advantages of smaller loss, higher response speed and better performance, and can significantly reduce a loss of the antenna at a high frequency. In some implementations, the MEMS switch can be applied to a microstrip antenna of a multiple-input and multiple-output (MIMO) communication system, and is used to control operation of units of the antenna. When the switch is in an on state, each unit operates independently, and due to small sizes of the units, in such case, the antenna operates in a higher frequency band: when the switch is in an off state, all the units of the antenna are connected together to operate as an integral unit, and in such case, a size of the antenna is increased, and an operating frequency band of the antenna is accordingly lowered. The antenna may adopt a coplanar waveguide feeding mode, so as to switch an operating frequency thereof among 2.26 GHZ, 2.7 GHZ and 3.15 GHz by controlling on and off of the MEMS switch.

It should be noted that relational terms such as "first" and "second" are only used to distinguish one entity or operation from another entity or operation, but do not necessarily require or imply that the entities or operations actually have such relationship or are actually in such order. Moreover, the terms "include", "comprise" or any other variation thereof are intended to indicate a non-exclusive inclusion, so that a process, method, article, or device including a series of elements, does not only include those listed elements but also includes other elements not explicitly listed, or the elements inherent in such process, method, article, or device. If there are no more limitations, limiting an element by "including a . . . " does not exclude existence of other identical elements in the process, method, article, or device including the element.

The present disclosure does not illustrate all the details or is not limited to the detailed description. Various modifications and changes may be made according to the above description. The implementations are chosen and described herein for better explaining the principle and the practical applications of the present disclosure, so that those skilled in the art can make full use of the present disclosure and the modifications made based on the present disclosure. The present disclosure is only limited to the claims, the scope of the claims, and an equivalent of the claims.

What is claimed is:

1. A radio frequency micro-electro-mechanical switch, comprising:
   a substrate; and
   a signal electrode, a first ground electrode, a second ground electrode and a connecting membrane bridge,
   wherein the signal electrode, the first ground electrode, the second ground electrode and the connecting membrane bridge are disposed on the substrate, the connecting membrane bridge crosses over the signal electrode, and
   the connecting membrane bridge comprises a body portion and at least two stretchable structures,
   each of the stretchable structures is stretchable in a stretchable direction the same as an extending direction in which the connecting membrane bridge extends,
   an end of the body portion is connected to the first ground electrode through at least one stretchable structure of the at least two stretchable structures, and another end of the body portion is connected to the second ground electrode through at least one other stretchable structure of the at least two stretchable structures,
   the body portion comprises a base material of the connecting membrane bridge, and is provided therein with a plurality of opening patterns, the opening patterns each penetrate through the base material of the connecting membrane bridge.

2. The radio frequency micro-electro-mechanical switch of claim 1, wherein the plurality of opening patterns are uniformly arranged.

3. The radio frequency micro-electro-mechanical switch of claim 1, wherein a thickness of the base material of the connecting membrane bridge is in a range from 1 μm to 3 μm.

4. The radio frequency micro-electro-mechanical switch of claim 1, wherein the body portion and the stretchable structure are formed into one piece.

5. The radio frequency micro-electro-mechanical switch of claim 1, wherein the substrate comprises a flexible substrate.

6. The radio frequency micro-electro-mechanical switch of claim 1, wherein the connecting membrane bridge extends in a first direction; and each of the stretchable structures comprises:
   a plurality of first connection portions arranged in the first direction and each extending in a second direction that intersects the first direction; and
   a plurality of second connection portions, each of the second connection portions extending in the first direction,
   wherein any two adjacent first connection portions are connected end to end through a second connection portion.

7. The radio frequency micro-electro-mechanical switch of claim 6, wherein each of lengths of the second connection portions is not greater than each of lengths of the first connection portions.

8. The radio frequency micro-electro-mechanical switch of claim 6, wherein
   in part of the stretchable structures, the first connection portions have a same length and different widths; and the second connection portions have a same length and a same width.

9. The radio frequency micro-electro-mechanical switch of claim 1, wherein shapes of the opening patterns comprise a circular shape.

10. The radio frequency micro-electro-mechanical switch of claim 9, wherein a material of the connecting membrane bridge comprises a conductive metal.

11. A radio frequency device, comprising the radio frequency micro-electro-mechanical switch of claim 1.

12. The radio frequency device of claim 11, comprising: any one of a filter, a voltage-controlled oscillator, a phase shifter and a reconfigurable antenna.

* * * * *